United States Patent
Kim et al.

(10) Patent No.: US 9,903,989 B2
(45) Date of Patent: Feb. 27, 2018

(54) METAL STRUCTURE FOR DECORATIVE BEZEL AND METHOD FOR MANUFACTURING SAME

(71) Applicant: LG Chem, Ltd., Seoul (KR)

(72) Inventors: Sujin Kim, Daejeon (KR); Jin Hyong Lim, Daejeon (KR); Song Ho Jang, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/416,993

(22) PCT Filed: Aug. 30, 2013

(86) PCT No.: PCT/KR2013/007857
§ 371 (c)(1),
(2) Date: Jan. 23, 2015

(87) PCT Pub. No.: WO2014/035196
PCT Pub. Date: Mar. 6, 2014

(65) Prior Publication Data
US 2015/0212244 A1    Jul. 30, 2015

(30) Foreign Application Priority Data

Aug. 31, 2012 (KR) .................. 10-2012-0096649

(51) Int. Cl.
*B32B 37/14* (2006.01)
*G02B 5/22* (2006.01)
(Continued)

(52) U.S. Cl.
CPC ............... *G02B 5/22* (2013.01); *B32B 37/14* (2013.01); *C23C 14/0015* (2013.01);
(Continued)

(58) Field of Classification Search
CPC .......... G02B 5/223; G02B 5/22; G02B 5/201; G02B 5/204; A61F 9/022;
(Continued)

(56) References Cited

U.S. PATENT DOCUMENTS

2002/0118177 A1* 8/2002 Newton ................ G06F 3/0421
345/173
2004/0113899 A1    6/2004 Nakayama
(Continued)

FOREIGN PATENT DOCUMENTS

CN    202712274 U    1/2013
EP    1 454 999 A1    9/2004
(Continued)

*Primary Examiner* — William R Alexander
*Assistant Examiner* — Henry Duong
(74) *Attorney, Agent, or Firm* — Dentons US LLP

(57) ABSTRACT

Provided is a metal structure body comprising a substrate, a metal layer, and a color adjustment layer, where various colors are implemented by adjusting a thickness of the color adjustment layer, and a method for manufacturing the same. The metal structure body can implement various colors while having a small thickness, and has an effect that resistance characteristics of a metal layer do not deteriorate. The metal structure body can be applied to a bezel of a display board, to a touch screen panel and a display device.

16 Claims, 4 Drawing Sheets

(51) Int. Cl.
*C23C 14/00* (2006.01)
*C23C 14/34* (2006.01)
*C23C 14/20* (2006.01)
*C23C 28/00* (2006.01)

(52) U.S. Cl.
CPC ............ *C23C 14/205* (2013.01); *C23C 14/34* (2013.01); *C23C 28/322* (2013.01); *C23C 28/34* (2013.01); *B32B 2307/402* (2013.01); *B32B 2311/00* (2013.01); *B32B 2457/20* (2013.01)

(58) Field of Classification Search
CPC ........... B32B 2307/402; B32B 2311/00; B32B 2457/20; B32B 37/14; C23C 14/34; C23C 14/0015; C23C 28/322; C23C 14/205; C23C 28/34
USPC ......................................................... 359/885
See application file for complete search history.

(56) References Cited

U.S. PATENT DOCUMENTS

| | | | |
|---|---|---|---|
| 2005/0185518 A1 | 8/2005 | Kawakami et al. | |
| 2007/0102192 A1 | 5/2007 | Naito et al. | |
| 2007/0154693 A1 | 7/2007 | Tsai et al. | |
| 2009/0017898 A1* | 1/2009 | Fujimoto | G07F 17/32 463/20 |
| 2009/0291293 A1* | 11/2009 | Sakakura | H01L 51/0097 428/323 |
| 2010/0072058 A1 | 3/2010 | Chiang et al. | |
| 2011/0174669 A1 | 7/2011 | Chen et al. | |
| 2011/0234746 A1* | 9/2011 | Saleh | G06F 3/041 348/14.03 |
| 2013/0147742 A1 | 6/2013 | Lee | |
| 2013/0215067 A1* | 8/2013 | Hwang | G02B 5/003 345/173 |
| 2013/0248227 A1 | 9/2013 | Kim et al. | |

FOREIGN PATENT DOCUMENTS

| | | | | |
|---|---|---|---|---|
| JP | 1993-195205 A | 8/1993 | | |
| JP | 2008-039960 A | 2/2008 | | |
| JP | 2008-153596 A | 7/2008 | | |
| JP | 2008-251822 A | 10/2008 | | |
| JP | 2009-186929 A | 8/2009 | | |
| JP | 2010-173273 A | 8/2010 | | |
| JP | 2012-118237 A | 6/2012 | | |
| JP | 2013-122762 A | 6/2013 | | |
| KR | 10-2002-0093088 A | 12/2002 | | |
| KR | 2002-0093088 A | 12/2002 | | |
| KR | 2007-0052475 A | 3/2008 | | |
| KR | 100817107 B1 | 3/2008 | | |
| KR | 10-2011-0034889 A | 4/2011 | | |
| KR | 2011-0034889 A | 4/2011 | | |
| KR | 10-1131887 B1 | 4/2012 | | |
| WO | 2005/060326 A1 | 6/2005 | | |
| WO | 2012/053818 A2 | 4/2012 | | |
| WO | WO 2012053818 A2 * | 4/2012 | ............ | G02B 5/003 |
| WO | 2012/067444 A2 | 5/2012 | | |

* cited by examiner

[Figure 1]
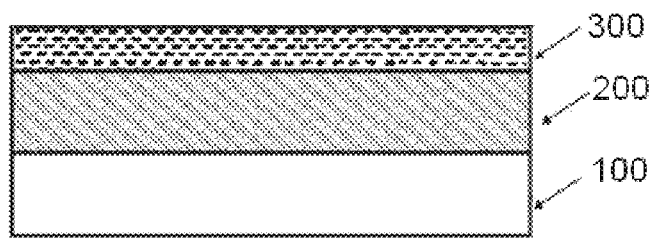
[Figure 2]
|  | Thickness of Color contol layer | *L | *a | *b | Color |
|---|---|---|---|---|---|
| Exam. 1 | 60nm | 14.92 | 9.35 | -35.49 |  |
| Exam. 2 | 50nm | 10.14 | 34.71 | -28.68 |  |
| Exam. 3 | 40nm | 60.99 | 6.34 | 42.80 |  |
| Exam. 4 | 30nm | 75.04 | 0.51 | 23.78 |  |
| Exam. 5 | 20nm | 86.28 | -0.65 | 5.40 |  |
| Exam. 6 | 10nm | 86.94 | -0.81 | 5.09 |  |
| Com. Exam. 1 | only Al | 95.76 | -0.36 | -0.42 |  |

[Figure 3]
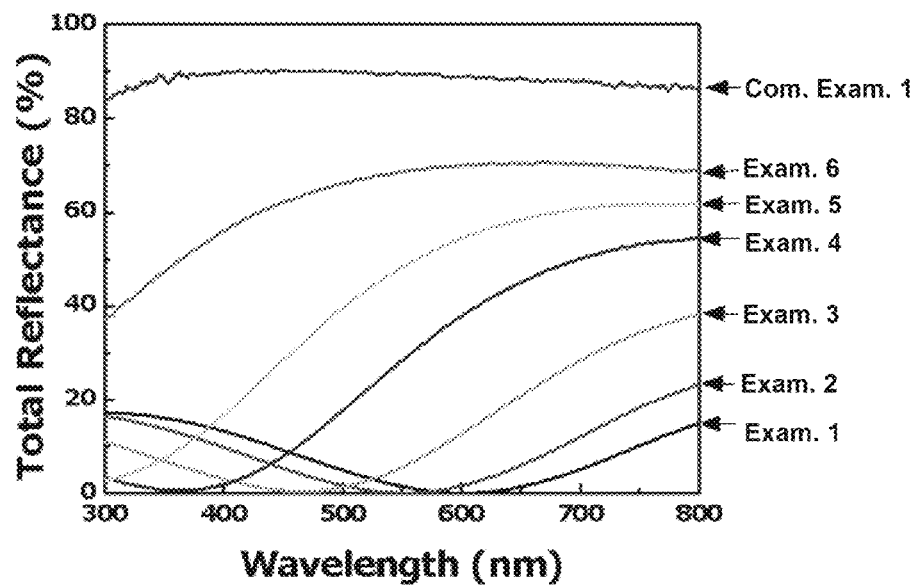
[Figure 4]
|  | Thickness of Color control layer | L* | a* | b* | Color |
|---|---|---|---|---|---|
| Exam. 7 | 100nm | 64.35 | -0.10 | 9.64 | |
| Exam. 8 | 75nm | 55.18 | -6.01 | -2.41 | |
| Exam. 9 | 50nm | 28.86 | -10.61 | -24.89 | |
| Exam. 10 | 40nm | 19.86 | 10.34 | -27.21 | |
| Exam. 11 | 30nm | 30.05 | 33.36 | 1.73 | |
| Com. Exam. 2 | Cu only | 87.69 | 13.39 | 16.23 | |

[Figure 5]
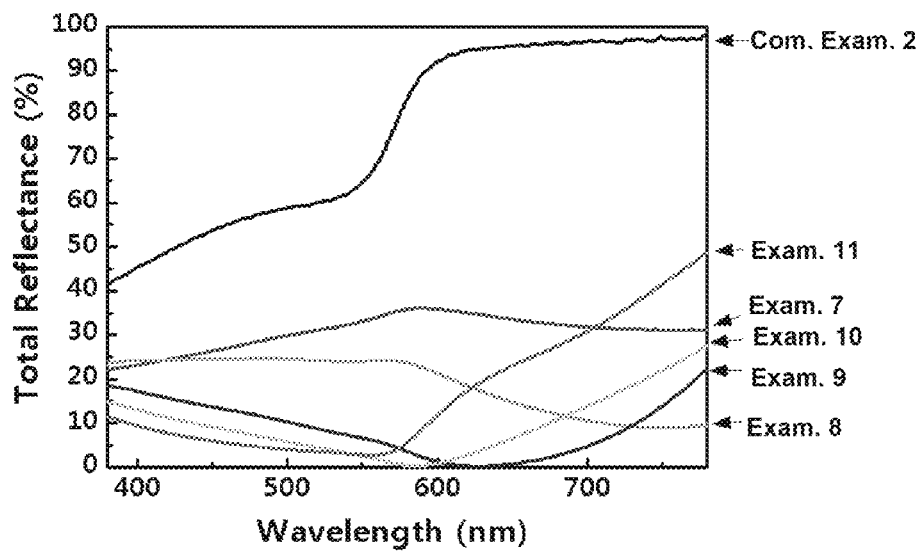
[Figure 6]
| | Thickness of Color adjustment layer | L* | a* | b* | Color |
|---|---|---|---|---|---|
| Exam. 12 | 80nm | 54.81 | -5.71 | -2.83 | |
| Exam. 13 | 60nm | 40.42 | -7.51 | -16.62 | |
| Exam. 14 | 40nm | 23.41 | 8.26 | -13.62 | |
| Exam. 15 | 20nm | 50.34 | 5.62 | 17.37 | |
| Com. Exam. 3 | Al 5nm only | 71.22 | 0.91 | 5.34 | |

[Figure 7]
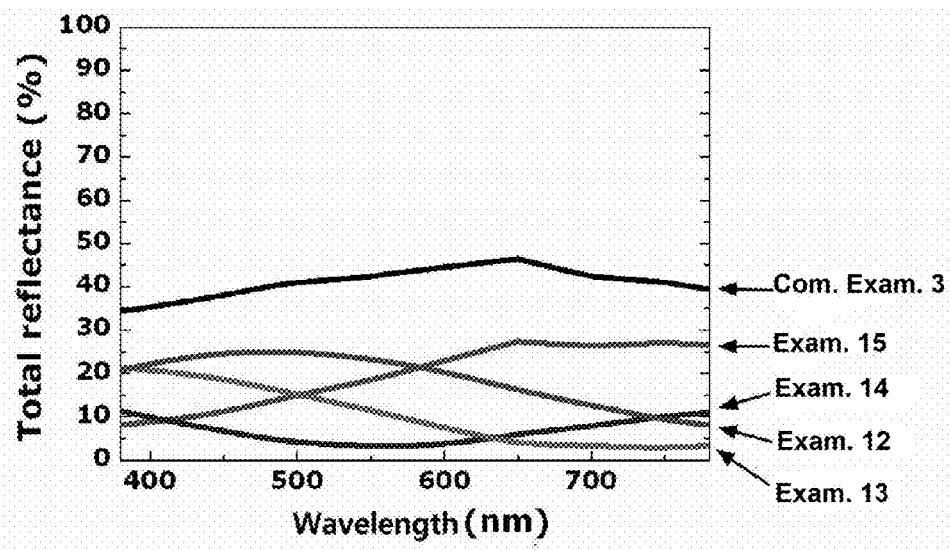
[Figure 8]
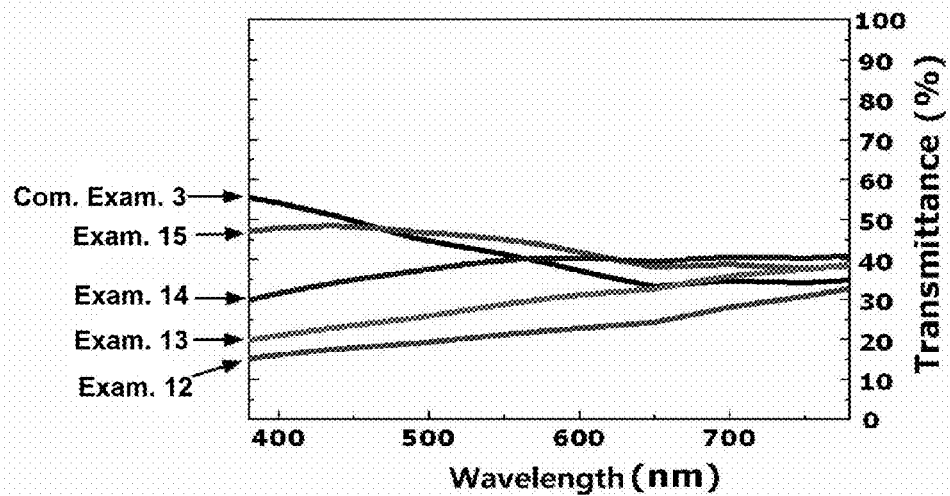

METAL STRUCTURE FOR DECORATIVE BEZEL AND METHOD FOR MANUFACTURING SAME

CROSS-REFERENCE TO RELATED APPLICATIONS

This application is a National Stage Entry of International Application No. PCT/KR2013/007857, filed on Aug. 30, 2013, which claims priority to and the benefit of Korean Patent Application No. 10-2012-0096649, filed on Aug. 31, 2012, both of which are incorporated herein by reference in their entirety.

TECHNICAL FIELD

Background Art

In general, when a metal layer is applied to a display device, in the case where various colors are needed, the colors are implemented with coating solutions using dyes, or by a plating method.

The method in the related art needs an additional process other than a process of manufacturing a metal layer and thus has a problem in terms of process costs. Further, when colors are implemented with coating solutions using dyes, the metal layer has a thickness of approximately several tens of micrometers, and thus there is a problem in that the thickness of the metal layer is increased, and accordingly, resistance characteristics of the metal also deteriorate.

Therefore, there is a need for developing a new technology for implementing a metal layer having various colors.

BRIEF SUMMARY OF THE INVENTION

Technical Problem

The present application has been made in an effort to provide a metal structure body for implementing a metal layer having various colors.

Technical Solution

An exemplary embodiment of the present application provides a metal structure body comprising: a substrate; a metal layer; and a color adjustment layer.

Another exemplary embodiment of the present application provides a method for manufacturing a metal structure body, the method comprising: forming a metal layer on a substrate; and forming a color adjustment layer on the metal layer.

Another exemplary embodiment of the present application provides a method for manufacturing a metal structure body, the method comprising: forming a color adjustment layer on a substrate; and forming a metal layer on the color adjustment layer.

Another exemplary embodiment of the present application provides a bezel of a display board comprising the metal structure body.

Another exemplary embodiment of the present application provides a touch screen panel comprising the metal structure body.

Another exemplary embodiment of the present application provides a display device comprising the metal structure body.

Advantageous Effects

The metal structure body according to an exemplary embodiment of the present application may implement various colors while having a small thickness, and has an effect that resistance characteristics of a metal layer do not deteriorate. Therefore, when the metal structure body of the present application is used and applied to a bezel of a display board, the metal structure body of the present invention shows an excellent decoration effect, and may also be applied to a touch screen panel and a display device.

DESCRIPTION OF DRAWINGS

FIG. 1 is a view illustrating a laminate structure of a metal structure body comprising a color adjustment layer as an exemplary embodiment of the present application.

FIG. 2 illustrates a lightness value ($L^*$), a color value ($^*a$), and a chroma value ($^*b$) based on the CIE $L^*a^*b^*$ color coordinates of the metal structure body according to Examples 1 to 6 and Comparative Example 1.

FIG. 3 illustrates a reflectance of the metal structure body according to Examples 1 to 6 and Comparative Example 1 at all wavelengths of visible light.

FIG. 4 illustrates a lightness value ($L^*$), a color value ($^*a$), and a chroma value ($^*b$) based on the CIE $L^*a^*b^*$ color coordinates of the metal structure body according to Examples 7 to 11 and Comparative Example 2.

FIG. 5 illustrates a reflectance of the metal structure body according to Examples 7 to 11 and Comparative Example 2 at all wavelengths of visible light.

FIG. 6 illustrates a lightness value ($L^*$), a color value ($^*a$), and a chroma value ($^*b$) based on the CIE $L^*a^*b^*$ color coordinates of the metal structure body according to Examples 12 to 15 and Comparative Example 3.

FIG. 7 illustrates a reflectance of the metal structure body according to Examples 12 to 15 and Comparative Example 3 at all wavelengths of visible light.

FIG. 8 illustrates a transmittance of the metal structure body according to Examples 12 to 15 and Comparative Example 3 at all wavelengths of visible light.

DETAILED DESCRIPTION OF THE INVENTION

Hereinafter, the present application will be described in more detail.

In the present specification, a display device collectively refers to a TV, a computer monitor or the like, and comprises a display element that forms an image, and a casing that supports the display element.

Examples of the display element comprise a plasma display panel (PDP), a liquid crystal display (LCD), an electrophoretic display, a cathode-ray tube (CRT), or an OLED display and the like. The display element may comprise an RGB pixel pattern for implementing an image and an additional optical filter.

Meanwhile, in relation to the display device, as spread of mobile devices, smart phones, tablet PCs, IPTVs, and the like is accelerating, a need for a touch function, in which a human hand is directly used as an input device without a separate input device, such as a keyboard and a remote control, is gradually increasing. Further, a multi-touch function that is capable of recognizing a specific point and writing is also required.

"Bezel" used in the present specification means at least one border portion comprised in a display board. For example, in a mobile device, the bezel may be comprised in a region other than an effective screen part. For example, a sensor part, a camera part, a logotype part, a button part or an open part, and the like may be comprised in the border portion region.

Various colors are introduced into the bezel portion for external decoration. Currently, the color of the bezel portion is implemented using a silk screen method in many cases. When the silk screen method is used, colors are developed in a thickness of several micrometers. Since there is a problem in that the larger the height of the bezel portion is, the more difficult it is for the bezel portion to be brought into contact with a screen part and a touch panel, the smaller height of the bezel portion is advantageous. When a metal structure body according to an exemplary embodiment of the present application is applied to the bezel, a color may be developed using a color adjustment layer having a thickness from 5 nm to 500 nm, and therefore there is an advantage in that the height of the bezel portion is lowered, thereby solving a problem of defective contact of the screen part. In addition, in an integrated touch panel in which an outermost part and a touch panel part of a display board is one structure body, there is also an advantage in that the bezel part and an electrode layer may be implemented in one process.

Thus, the metal structure body according to an exemplary embodiment of the present application comprises: a substrate; a metal layer; and a color adjustment layer. Here, the color adjustment layer may be provided on at least one surface of the metal layer. For example, the color adjustment layer may be provided on only one surface of the metal layer, and on both surfaces of the metal layer.

In an exemplary embodiment of the present application, the metal layer may be provided between the substrate and the color adjustment layer.

In an exemplary embodiment of the present application, the color adjustment layer may be provided between the substrate and the metal layer.

A metal structure body according to an exemplary embodiment of the present application may comprise: a substrate; a metal layer provided on the substrate; and a color adjustment layer provided on the metal layer.

A metal structure body according to an exemplary embodiment of the present application may comprise: a substrate; a color adjustment layer provided on the substrate; and a metal layer provided on the color adjustment layer.

A metal structure body according to an exemplary embodiment of the present application may comprise: a substrate; a color adjustment layer provided on the substrate; a metal layer provided on the color adjustment layer; and a color adjustment layer provided on the metal layer.

In an exemplary embodiment of the present application, the metal layer or the color adjustment layer may be patterned. The metal layer may be a patterned metal layer, and the color adjustment layer may be a patterned color adjustment layer. A form of the pattern will be described below.

The inventors of the present application have tried to develop a metal structure body which may implement various colors while having a small thickness, and in which resistance characteristics of a metal layer do not deteriorate. As a result, the inventors found that various colors may be implemented when a color adjustment layer, which comprises the same metal as the metal layer, is introduced on one surface of the metal layer. Furthermore, various colors may be implemented when the thickness of the color adjustment layer is differently adjusted.

In this case, it is possible to adjust the thickness of the color adjustment layer in a range of 500 nm or less, specifically 300 nm or less, and more specifically 100 nm or less.

When the thickness of the color adjustment layer is 500 nm or less, specifically 300 nm or less, a thickness sufficient to adjust various colors may be obtained, and the thickness is advantageous in terms of process productivity or process costs. Further, it is preferred that the thickness of the color adjustment layer is 5 nm or more, specifically 10 nm or more. When the thickness of the color adjustment layer is less than 5 nm, the thickness is so small that the color adjustment effect is insignificant.

In the metal structure body, sheet resistance of the metal layer or the color adjustment layer before being patterned may be adjusted according to the thickness of the metal layer or color adjustment layer.

In an exemplary embodiment of the present application, the metal structure body may have a refractive index n of more than 0 and 3 or less.

The metal structure body according to an exemplary embodiment of the present application may have an extinction coefficient k of the color adjustment layer from 0.2 to 2.5.

When the extinction coefficient k is 0.2 or more, there is an effect of enabling various colors to be implemented. The extinction coefficient k is also referred to as an absorption coefficient, and is a measure which may define how strongly the metal structure body absorbs light at a specific wavelength and a factor which determines transmittance of the metal structure body. For example, in the case of a transparent dielectric material, $k<0.2$, which is very low. However, the higher the content of a metal component in a material is, the higher the k value is. When the amount of metal component is more increased, transmission hardly occurs, only surface reflection occurs in the metal in most cases, and the extinction coefficient k is more than 2.5.

Absorption of light occurs according to the n and k values, and thus a color may be implemented while reflectance of the metal layer is reduced. The n and k values of the color adjustment layer affect a destructive interference and reduce the reflectance at a specific wavelength in a reflection spectrum, thereby implementing the color.

In an exemplary embodiment of the present application, the reflectance may mean a reflectance to light having a wavelength of visible light, specifically a wavelength from 300 nm to 800 nm, and more specifically from 380 nm to 780 nm, which is incident at 90 degrees to a surface desired to be measured, after a surface opposite to the surface desired to be measured is treated with a black layer (perfect black).

The reflectance may be measured in a direction of a surface opposite to a surface on which the color adjustment layer is in contact with the metal layer when the metal layer is provided between the substrate and the color adjustment layer. Specifically, when the color adjustment layer comprises a first surface that is in contact with the metal layer and a second surface facing the first surface, the reflectance may be measured in a direction of the second surface.

In addition, the reflectance may be measured at the substrate side when the color adjustment layer is provided between the metal layer and the substrate.

In the present specification, the total reflectance may be a value measured based on a wavelength value from 300 nm to 800 nm, and specifically from 380 nm to 780 nm in reflected light reflected by a pattern layer or a metal structure body to which light is incident when the incident light is defined as 100%.

In the metal structure body according to an exemplary embodiment of the present application, the color adjustment layer may comprise a first surface that is in contact with the metal layer and a second surface facing the first surface. In this case, when the total reflectance of the metal structure body is measured at the second surface side of the color adjustment layer, the total reflectance (Rt) of the metal structure body may be calculated by the following Equation 1.

Total reflectance (Rt)=Reflectance of substrate+Closure ratio×Reflectance of color adjustment layer [Equation 1]

Furthermore, when two metal structure bodies are laminated in the configuration of the metal structure body, the total reflectance (Rt) of the metal structure body may be calculated by the following Equation 2.

Total reflectance (Rt)=Reflectance of substrate+Closure ratio×Reflectance of color adjustment layer×2 [Equation 2]

In Equations 1 and 2, the total reflectance of the substrate may be a reflectance of a touch reinforced glass, and when a surface is a film, the total reflectance of the substrate may be a reflectance of the film.

Further, the closure ratio may be represented by an area ratio of a region covered by a conductive pattern, that is, (1—opening ratio), based on a plane of the metal structure body.

In an exemplary embodiment of the present application, when the thickness of the color adjustment layer is adjusted, a color may be implemented while the reflectance of the metal structure body at a predetermined wavelength, which is measured by the method, is lowered.

In an exemplary embodiment of the present application, a material for the metal layer is appropriately a material having specific resistance from $1\times10^{-6}$ Ω•cm to $30\times10^{-6}$ Ω•cm and preferably $1\times10^{-6}$ Ω•cm to $7\times10^{-6}$ Ω•cm.

In an exemplary embodiment of the present application, specific examples of the material for the metal layer comprise one or two or more selected from the group consisting of aluminum (Al), copper (Cu), nickel (Ni), vanadium (V), tungsten (W), tantalum (Ta), molybdenum (Mo), neodymium (Nd), titanium (Ti), iron (Fe), chromium (Cr), cobalt (Co), gold (Au), and silver (Ag). For example, the material may be an alloy of two or more selected from the aforementioned metals. More specifically, the material may comprise molybdenum, aluminum, or copper. The metal layer may be a single film or a multilayered film.

In an exemplary embodiment of the present application, a thickness of the metal layer from 1 nm to 10 μm may exhibit a more excellent effect in terms of conductivity of the metal layer and costs of the process of forming a pattern. The metal layer may be usually opaque, but may be transparent when the thickness of the metal layer is in a range of several nanometers, which is very small. When the metal layer is opaque, it is possible to obtain an opaque metal structure body having various colors in which a color adjustment layer is comprised in an opaque metal layer, and when the metal layer is transparent, it is possible to obtain a transparent metal structure body having various colors in which a color adjustment layer is comprised in a transparent metal layer. For example, when the metal layer is formed of Al, in the case where the thickness of the metal layer is 20 nm to 10 μm, the reflectance is high and the transmittance is very low, and thus the metal layer may be opaque. Furthermore, when the thickness of the metal layer is 1 nm to 20 μm, the total reflectance may be 50% or less in the visible light region, and the average transmittance may also be 50% or less, and thus the metal layer may be transparent.

Further, in the metal structure body according to an exemplary embodiment of the present application, the color adjustment layer may be directly provided on the substrate or the metal layer without interposing an adhesion layer or an adhesive layer. The adhesion layer or the adhesive layer may affect durability or optical properties. In addition, the metal structure body according to an exemplary embodiment of the present application is completely different from the case of using an adhesion layer or an adhesive layer in a manufacturing method. Furthermore, the metal structure body according to an exemplary embodiment of the present invention has excellent interfacial properties of the substrate or the metal layer and the color adjustment layer, compared to the case of using an adhesion layer or an adhesive layer.

In an exemplary embodiment of the present application, the color adjustment layer may be composed of a single layer, or a multilayer having two or more layers.

For example, the color adjustment layer may be used by comprising one or two or more selected from the group consisting of oxides of a metal, nitrides of a metal, oxynitrides of a metal, and carbides of a metal. The oxides, nitrides, oxynitrides, or carbides of the metal may be formed by a deposition condition and the like set by the person skilled in the art. The metal comprised in the color adjustment layer may be one or an alloy of two or more selected from the group consisting of aluminum (Al), copper (Cu), nickel (Ni), vanadium (V), tungsten (W), tantalum (Ta), molybdenum (Mo), neodymium (Nd), titanium (Ti), iron (Fe), chromium (Cr), cobalt (Co), gold (Au), and silver (Ag).

As a specific example thereof, the color adjustment layer may comprise both Ni and Mo. The color adjustment layer may comprise 50 to 98 atom % of Ni and 2 to 50 atom % of Mo, and may further comprise 0.01 to 10 atom % of other metals, for example, atoms such as Fe, Ta, and Ti. Here, the color adjustment layer may further comprise 0.01 to 30 atom % of nitrogen or 4 atom % or less of oxygen and carbon, if necessary.

As another specific example, the color adjustment layer may also comprise a dielectric material selected from $TiO_{2-x}$, $SiO_{2-x}$, $MgF_{2-x}$ and $SiN_{1.3-x}$ ($-1 \leq x \leq 1$) and/or a metal selected from the group consisting of aluminum (Al), copper (Cu), nickel (Ni), vanadium (V), tungsten (W), tantalum (Ta), molybdenum (Mo), neodymium (Nd), titanium (Ti), iron (Fe), chromium (Cr), cobalt (Co), gold (Au), and silver (Ag), and/or an alloy of two or more selected among them.

The color adjustment layer may also be composed of only the dielectric material.

When the dielectric material and the metal and/or the alloy are comprised together, it is preferred that the dielectric material is distributed so as to be gradually decreased as the dielectric material becomes distant from a direction to which external light is incident, and the metal and the alloy components are distributed in a direction opposite to the direction. In this case, it is preferred that the content of the dielectric material is 20 to 50 wt % and the content of the metal is 50 wt % to 80 wt %. When the color adjustment layer further comprises the alloy, it is preferred that the color adjustment layer comprises 10 to 30 wt % of the dielectric material, 50 to 80 wt % of the metal, and 5 to 40 wt % of the alloy.

As another specific example, the color adjustment layer may be formed of a thin film comprising an alloy of nickel and vanadium, and one or more of oxide, nitride and oxynitride of nickel and vanadium. In this case, it is preferred that vanadium is comprised in an amount from 26 atom % to 52 atom %, and it is preferred that an atomic ratio of vanadium to nickel is 26/74 to 52/48.

As another specific example, the color adjustment layer may comprise a transition layer comprising two or more elements in which a composition ratio of one element is increased by about maximum 20% per 100 angstrom according to a direction to which external light is incident. In this case, the one element may be a metal element such as nickel (Ni), vanadium (V), tungsten (W), tantalum (Ta), molybdenum (Mo), niobium (Nb), titanium (Ti), iron (Fe), chromium (Cr), cobalt (Co), aluminum (Al), or copper (Cu), and the element other than the metal element may be oxygen, nitrogen, or carbon.

As another specific example, the color adjustment layer may comprise a first chromium oxide layer, a metal layer, a second chromium oxide layer, and a chromium minor, and in this case, may comprise a metal selected from nickel (Ni), vanadium (V), tungsten (W), tantalum (Ta), molybdenum (Mo), niobium (Nb), titanium (Ti), iron (Fe), cobalt (Co), aluminum (Al), and copper (Cu), instead of chromium. It is preferred that the metal layer has a thickness from 10 nm to 30 nm, the first chrome oxide layer has a thickness from 35 nm to 41 nm, and the second chrome oxide layer has a thickness from 37 nm to 42 nm.

As another specific example, as the color adjustment layer, a laminate structure of an alumina ($Al_2O_3$) layer, a chromium oxide ($Cr_2O_3$) layer, and a chromium (Cr) layer may be used. Here, the alumina layer has a characteristic of improving a reflection characteristic and preventing a light diffusion, and the chromium oxide layer may improve a contrast characteristic by decreasing a specular reflectance.

As another specific example, the color adjustment layer may use a laminate structure composed of aluminum nitride (AlNx) and Al. Here, the aluminum nitride (AlNx) layer may improve a contrast characteristic by decreasing reflectance of the entire layer.

In an exemplary embodiment of the present application, the metal layer may comprise aluminum, and the color adjustment layer may comprise an oxynitride of aluminum. In this case, a metal structure body having various desired colors may be obtained by adjusting the thickness of the color adjustment layer. For example, the metal structure body may have a blue color by adjusting the thickness of the color adjustment layer. Otherwise, for example, the metal structure body may have a purple color by adjusting the thickness of the color adjustment layer. Otherwise, for example, the metal structure body may have a gold color by adjusting the thickness of the color adjustment layer.

In an exemplary embodiment of the present application, the metal layer may comprise copper, and the color adjustment layer may comprise an oxide of copper. In this case, a metal structure body having various desired colors may be obtained by adjusting the thickness of the color adjustment layer. For example, the metal structure body may have a light brown color by adjusting the thickness of the color adjustment layer. Otherwise, for example, the metal structure body may have a dark sky-blue color by adjusting the thickness of the color adjustment layer. Otherwise, for example, the metal structure body may have a blue color by adjusting the thickness of the color adjustment layer. Otherwise, for example, the metal structure body may have a violet color by adjusting the thickness of the color adjustment layer. Otherwise, for example, the metal structure body may have a purple color by adjusting the thickness of the color adjustment layer.

In an exemplary embodiment of the present application, the color adjustment layer and the metal layer may be simultaneously or separately patterned.

In an exemplary embodiment of the present application, the patterned color adjustment layer and the patterned metal layer may form a laminate structure by a simultaneous or separate patterning process. In this regard, the laminate structure may be differentiated from a structure in which at least a part of a light absorbing material is depressed or dispersed in a conductive pattern, or a structure in which a part of a conductive pattern of a single layer at the surface side is physically or chemically modified by an additional surface treatment.

Here, the color adjustment layer may have a pattern with the same shape as that of the metal layer. However, the pattern size of the patterned color adjustment layer need not be completely the same as that of the patterned metal layer, and the case where the line width of the pattern in the patterned color adjustment layer is smaller or larger than that of the pattern in the patterned metal layer is also comprised in the scope of the present application. Specifically, the line width of the pattern in the patterned color adjustment layer may be 80% to 120% of the line width of the pattern in the patterned metal layer. Further, the patterned color adjustment layer may have an area which is 80% to 120% of an area occupied by the patterned metal layer.

In an exemplary embodiment of the present application, the pattern of the color adjustment layer is preferably in the form of a pattern having a line width which is the same as or larger than the line width of the pattern of the metal layer. When the patterned color adjustment layer has a pattern shape having a line width larger than that of the pattern in the patterned metal layer, since an effect in which the patterned color adjustment layer shields the patterned metal layer when observed by a user may be more significantly imparted, there is an advantage in that an effect by gloss or reflection of the patterned metal layer itself may be efficiently blocked. However, even though the line width of the pattern in the patterned color adjustment layer is the same as that of the pattern in the patterned metal layer, a target effect of the present application may be achieved.

In an exemplary embodiment of the present application, the line width of the pattern in the patterned metal layer may be more than 0 μm and 10 μm or less, specifically 0.1 μm or more and 10 μm or less, more specifically 0.2 μm or more to 8 μm or less, and even more specifically 0.5 μm or more to 5 μm or less.

In an exemplary embodiment of the present application, the opening ratio of the patterned metal layer, that is, the ratio of the area which is not covered by the pattern may be 70% or more, 85% or more, and 95% or more. In addition, the opening ratio of the patterned metal layer may be 90% to 99.9%, but is not limited thereto.

In an exemplary embodiment of the present application, the pattern of the patterned metal layer or the patterned color adjustment layer may be a regular pattern or an irregular pattern.

As the regular pattern, a pattern form in the art, such as a mesh pattern may be used. The irregular pattern is not particularly limited, but may also be in the form of a boundary of figures constituting a Voronoi diagram. In the present application, when the irregular pattern and the patterned color adjustment layer are used together, a diffracted pattern of reflected light by lighting having directivity may be removed by the irregular pattern, and an influence of scattering light may be minimized by the patterned color adjustment layer, thereby adjusting implementation of various colors.

In the metal structure body according to an exemplary embodiment of the present application, a transparent board may be used as the substrate, but the substrate is not particularly limited, and for example, glass, a plastic board, a plastic film, and the like may be used.

Examples of the metal structure body according to an exemplary embodiment of the present application are illustrated in the following FIG. 1. FIG. 1 is for illustrating a lamination sequence of the substrate, the metal layer, and the color adjustment layer, and when the metal structure body is actually applied to a bezel and the like of the display board, metal structure body may be a front layer or may be in the form of a pattern.

According to FIG. 1, the case where a substrate 100, a metal layer 200, and a color adjustment layer 300 are disposed in this order is illustrated. When a user observes a display board at the color adjustment layer side, the user may recognize various predetermined colors. In FIG. 1, the metal layer may be a patterned metal layer, and the color adjustment layer may be a patterned color adjustment layer.

In addition to the lamination sequence illustrated in FIG. 1, a substrate, a color adjustment layer, and a metal layer may be disposed in this order.

For example, the structure of the metal structure body according to an exemplary embodiment of the present application may be a structure of substrate/color adjustment layer/metal layer, a structure of substrate/metal layer/color adjustment layer, a structure of substrate/color adjustment layer/metal layer/color adjustment layer, a structure of substrate/color adjustment layer/metal layer/color adjustment layer/metal layer/color adjustment layer, a structure of substrate/color adjustment layer/metal layer/color adjustment layer/metal layer/color adjustment layer/metal layer/color adjustment layer, and the like. In the aforementioned explanation, the metal layer may be a patterned metal layer, and the color adjustment layer may be a patterned color adjustment layer.

A method for manufacturing a metal structure body according to an exemplary embodiment of the present application may comprise: forming a metal layer on a substrate; and forming a color adjustment layer on the metal layer.

A method for manufacturing a metal structure body according to an exemplary embodiment of the present application may comprise: forming a color adjustment layer on a substrate; and forming a metal layer on the color adjustment layer.

A method for manufacturing a metal structure body according to an exemplary embodiment of the present application may comprise: forming a color adjustment layer on a metal layer; and laminating one surface of the metal layer or the color adjustment layer, and a substrate.

The manufacturing method may further comprise patterning separately or simultaneously the metal layer and the color adjustment layer.

A method for manufacturing a metal structure body according to an exemplary embodiment of the present application may comprise: forming a patterned metal layer on a substrate; and forming a color adjustment layer before, after or before and after the forming of the patterned metal layer.

In an exemplary embodiment of the present application, a method for manufacturing the conductive structure body may comprise: forming a patterned color adjustment layer on a substrate; and forming a patterned metal layer after the forming of the patterned color adjustment layer.

A method for manufacturing a metal structure body according to an exemplary embodiment of the present application may comprise: forming a patterned color adjustment layer on a patterned metal layer; and laminating one surface of the patterned metal layer or the patterned color adjustment layer, and a substrate.

In the method for manufacturing a metal structure body, the explanation for the substrate, the metal layer and the color adjustment layer is as described above.

A method known in the art may be used for forming the metal layer. For example, the metal layer may be formed by a method, such as deposition, sputtering, wet coating, evaporation, electrolytic plating or electroless plating, and lamination of a metal foil, and specifically, may be formed using a sputtering method.

A method known in the art may be used even for forming the color adjustment layer. For example, the color adjustment layer may be formed by a method, such as deposition, sputtering, wet coating, evaporation, electrolytic plating or electroless plating, and lamination of a metal foil, and specifically, may be formed using a reactive sputtering method.

For example, in the case of $AlO_xN_y$ (x and y are each a ratio of the numbers of O and N atoms to one atom of Al) during the formation of the color adjustment layer, when a reactive sputtering method is used by using an Al metal target, the process may be performed by adjusting partial pressure of a reactive gas such as $O_2$ and $N_2$.

For example, in a case where the metal layer comprising Cu and the color adjustment layer comprising $CuO_x$ (x is a ratio of the number of O atoms to one atom of Cu) are formed, when an inert gas, for example, a gas such as Ar is used as a sputtering gas, there is an advantage obtained by using a CuO single material sputtering target. Therefore, since the CuO single material target is used, it is not necessary to adjust partial pressure of the reactive gas, and thus there is an advantage in that it is relatively easy to adjust the process and it is possible to perform a batch etching using a Cu etchant even in the formation of a final metal structure body.

In an exemplary embodiment of the present application, the method for forming the patterned metal layer is not particularly limited, and the patterned metal layer may be directly formed by a printing method, or a method for patterning the metal layer after forming the metal layer may be used.

In an exemplary embodiment of the present application, when the patterned metal layer is formed by using the printing method, ink or paste of the conductive material may be used, and the paste may further comprise a binder resin, a solvent, a glass frit, and the like in addition to the conductive material.

When a metal layer is formed, and then is patterned, a material having an etching resist characteristic may be used.

In an exemplary embodiment of the present application, a method of using an etching resist pattern may be used for the patterning of the metal layer. The etching resist pattern may be formed using a printing method, a photolithography method, a photography method, a method of using a mask, or a laser transfer, for example, a thermal transfer imaging, and the like, and the method is more preferably a printing method or a photolithography method, but is not limited thereto. The conductive thin film layer is etched and patterned using the etching resist pattern, and the etching resist pattern may be easily removed by a strip process.

An exemplary embodiment of the present application provides a bezel of a display board comprising the metal structure body. When the metal structure body is comprised in the bezel, it is possible to implement various colors, thereby providing an excellent decoration effect and an effect of decreasing sheet resistance of the metal layer.

An exemplary embodiment of the present application provides a display board comprising the metal structure body.

An exemplary embodiment of the present application provides a touch screen panel comprising the metal structure body. For example, the metal structure body according to an exemplary embodiment of the present application may be used as a touch-sensitive electrode board in a capacitance type touch screen panel.

An exemplary embodiment of the present application provides a display device comprising the touch screen panel.

The touch screen panel according to an exemplary embodiment of the present application may further comprise an additional structure body in addition to the above-described metal structure body comprising the substrate, the patterned metal layer, and the patterned color adjustment layer. In this case, the two structure bodies may be disposed in the same direction, or in a direction opposite to each other. Two or more structure bodies that may be comprised in the touch screen panel of the present application need not have the same structure, and only any one and preferably the structure body at the side that is closest to a user may comprise the substrate, the patterned metal layer, and the patterned color adjustment layer, and an additionally comprised structure body may not comprise the patterned color adjustment layer. Further, layer laminate structures in two or more structure bodies may be different from each other. When two or more structure bodies are comprised, an insulation layer may be provided therebetween. In this case, a function of an adhesive layer may be additionally imparted to the insulation layer.

The touch screen panel according may comprise: a lower substrate; an upper substrate; and an electrode layer provided on any one surface or both surfaces of a surface of the lower substrate, which is in contact with the upper substrate, and a surface of the upper substrate, which is in contact with the lower substrate. The electrode layer may serve to detect an X-axis position and a Y-axis position.

In this case, one or both of the electrode layer provided on the lower substrate and the surface of the lower substrate that is in contact with the upper substrate and the electrode layer provided on the upper substrate and the surface of the upper substrate that is in contact with the lower substrate may be the above-described metal structure body according to an exemplary embodiment of the present application. When only one of the electrode layers is the metal structure body according to the present application, the other one may have a conductive pattern known in the art.

When an electrode layer is provided on one surface of both the upper substrate and the lower substrate to form an electrode layer having two layers, an insulation layer or a spacer may be provided between the lower substrate and the upper substrate in order to constantly maintain the interval of the electrode layer and prevent a contact. The insulation layer may comprise an adhesive or a UV or thermally curable resin. The touch screen panel may further comprise a grounded part connected to the pattern of the metal layer in the above-described metal structure body. For example, the grounded part may be formed at a edge portion of a surface on which the pattern of the metal layer of the substrate is formed. In addition, at least one of an antireflection film, a polarizing film, and an anti-fingerprint film may be provided on at least one surface of a laminate comprising the metal structure body. A different type of functional film may be further comprised other than the above-described functional films depending on a design specification. The aforementioned touch screen panel may be applied to a display device, such as an OLED display panel, a liquid crystal display (LCD), a cathode-ray tube (CRT), or a plasma display panel (PDP).

In the touch screen panel according to an exemplary embodiment of the present application, the patterned metal layer and the patterned color adjustment layer may be provided on both surfaces of the substrate.

The touch screen panel according to an exemplary embodiment of the present application may further comprise an electrode part or a pad part on the metal structure body. In this case, an effective screen part, the electrode part, and the pad part may be formed of the same conductor.

In the touch screen panel according to an exemplary embodiment of the present application, the patterned color adjustment layer may be provided at a side observed by a user.

An exemplary embodiment of the present application provides a display device comprising the metal structure body. The metal structure body of the present application may be used in a color filter substrate or a thin film transistor substrate, a bezel pattern of a touch panel, a bridge pattern of a touch sensor and an electrode pattern of a touch sensor, and the like in the display device, and may be used even in any portion for exhibiting a decoration effect in the substrate.

Hereinafter, the present application will be described in more detail through Examples and Comparative Examples. However, the following Examples are provided for illustrative purposes only, and the scope of the present application is not limited thereby.

Examples 1 to 6

An Al layer having a thickness of 100 nm as a metal layer was manufactured on a PET substrate by a sputtering method. Nitrogen as a reactive gas was added on the Al layer, and an $AlO_xN_y$ (x>0, 0.3≤y≤1) layer was formed by a reactive sputtering method. In this case, a thickness was adjusted by varying a time for depositing $AlO_xN_y$. Thus, metal substrate bodies were manufactured by setting the thickness of a color adjustment layer (color control layer) to a thickness of 60 nm (Example 1), a thickness of 50 nm (Example 2), a thickness of 40 nm (Example 3), a thickness of 30 nm (Example 4), a thickness of 20 nm (Example 5), and a thickness of 10 nm (Example 6).

Examples 7 to 11

A Cu layer having a thickness of 100 nm as a metal layer is manufactured on a PET substrate by a sputtering method. Nitrogen as a reactive gas was added on the Cu layer, and a $CuO_x$ (0.5≤x≤1.5) layer was formed by a reactive sputtering method. In this case, a thickness was adjusted by varying a time for depositing $CuO_x$. Thus, metal substrate bodies were manufactured by setting the thickness of a color adjustment layer (color control layer) to a thickness of 100 nm (Example 7), a thickness of 75 nm (Example 8), a thickness of 50 nm (Example 9), a thickness of 40 nm (Example 10), and a thickness of 30 nm (Example 11).

Comparative Examples 1 and 2

An Al layer (Comparative Example 1) having a thickness of 100 nm as a metal layer is manufactured on a PET substrate by a sputtering method, and a Cu layer (Comparative Example 1) having a thickness of 100 nm as a metal layer is manufactured on a PET substrate by a sputtering method.

FIG. 2 illustrates a lightness value (L*), a color value (*a), and a chroma value (*b) of the metal structure bodies according to Examples 1 to 6 and Comparative Example 1 based on the CIE (Commission Internationale de l'Eclairage) L*a*b* color coordinates. Furthermore, FIG. 3 illustrates the reflectance of the metal structure body at a wavelength from 300 nm to 800 nm as a region for all wavelengths of visible light at this time.

Referring to FIGS. 2 and 3, Example 1 showed a bluish-navy color) by lowering the reflectance at a wavelength from 550 nm to 650 nm approximately to 0%, and Example 2 showed a reddish-purple color by lowering the reflectance at a wavelength from 500 nm to 600 nm approximately to 0%. Further, Example 3 showed a gold reflected color by lowering the reflectance at a wavelength from 400 nm to 500 nm approximately to 0%, and Example 4 showed a light gold reflected color by lowering the reflectance at a wavelength from 300 nm to 400 nm approximately to 0%. In addition, Examples 5 and 6 showed a dark grey color lowering the reflectance at a short wavelength of 500 nm or less. However, Comparative Example 1 showed an inherent light grey color of Al.

Furthermore, FIG. 4 illustrates a lightness value (L*), a color value (*a), and a chroma value (*b) of the metal structure bodies according to Examples 7 to 11 and Comparative Example 2 based on the CIE L*a*b* color coordinates. Further, FIG. 5 illustrates the reflectance of the metal structure body at a wavelength from 300 nm to 800 nm as a region for all wavelengths of visible light at this time.

Referring to FIGS. 4 and 5, Example 7 showed a deep blue color of light brown color by lowering the reflectance at a short wavelength of 500 nm and a long wavelength of 700 nm to 30% or less, and Example 8 showed a dark sky-blue color by lowering the reflectance at a long wavelength of 600 nm or more to 20% or less. In addition, Example 9 showed a bluish reflected color by lowering the reflectance at a wavelength from 600 nm to 700 nm approximately to 0%, and Example 10 showed a violet reflected color by lowering the reflectance at a wavelength from 550 nm to 600 nm approximately to 0%. Furthermore, Example 11 showed a purple color by lowering the reflectance at a short wavelength of 600 nm or less to 10% or less. However, in Comparative Example 2, an inherent color of Cu was displayed.

Examples 12 to 15

An Al layer having a thickness of 5 nm as a metal layer is manufactured on a PET substrate by a sputtering method. Nitrogen as a reactive gas was added on the Al layer, and an $AlO_xN_y$ ($x>0$, $0.3 \leq y \leq 1$) layer was formed by a reactive sputtering method. In this case, a thickness was adjusted by varying a time for depositing $AlO_xN_y$. Thus, metal substrate bodies were manufactured by setting the thickness of a color adjustment layer (color control layer) to a thickness of 80 nm (Example 12), a thickness of 60 nm (Example 13), a thickness of 40 nm (Example 14), and a thickness of 20 nm (Example 15).

Comparative Example 3

An Al layer (Comparative Example 3) having a thickness of 5 nm as a metal layer is manufactured on a PET substrate by a sputtering method.

FIG. 6 illustrates a lightness value (L*), a color value (*a), and a chroma value (*b) of the metal structure bodies according to Examples 12 to 15 and Comparative Example 3 based on the CIE (Commission Internationale de l'Eclairage) L*a*b* color coordinates. Further, FIG. 7 illustrates the transmittance of the metal structure bodies according to Examples 12 to 15 and Comparative Example 3 at a wavelength of visible light, and FIG. 8 illustrates the transmittance of the metal structure bodies according to Examples 12 to 15 and Comparative Example 3 at a wavelength of visible light.

Referring to FIGS. 6 and 7, Example 12 showed a dark sky-blue color by lowering the reflectance at a long wavelength of 600 nm or more to 20% or less, Example 13 showed a blue color by lowering the reflectance at a wavelength from 600 nm to 700 nm approximately to 0%, Example 14 showed a reflected violet color by lowering the reflectance at a wavelength from 550 nm to 600 nm approximately to 0%, and Example 15 showed a light brown color by lowering the reflectance at a wavelength from 380 nm to 500 nm to 20% or less. However, Comparative Example 3 showed an inherent light grey color of Al.

Referring to FIG. 8, the transmittance of the metal structure bodies according to Examples 12 to 15 and Comparative Example 3 may be confirmed.

A person with ordinary skill in the art to which the present application pertains may perform various applications and modifications within the scope of the present application based on the foregoing contents.

Although the specific part of the present application has been described in detail, it is obvious to those skilled in the art that such a specific description is just a preferred embodiment and the scope of the present application is not limited thereby. Therefore, the substantial scope of the present application will be defined by the appended claims and equivalents thereto.

EXPLANATION OF REFERENCE NUMERALS AND SYMBOLS

100: Substrate
200: Metal layer
300: Color adjustment layer

The invention claimed is:

1. A bezel having a decorative color and a metal structure body for holding a display board, comprising:
    a substrate;
    a metal layer comprising aluminum and having a thickness from 1 nm to 10 µm; and
    a color adjustment layer comprising oxynitrides of aluminum and having a thickness of 500 nm or less and an extinction coefficient in the range of 0.2 to 2.5,
    wherein the metal layer is a patterned metal layer, and the color adjustment layer is a patterned color adjustment layer, and
    wherein various colors are implemented by adjusting a thickness of the color adjustment layer.

2. The bezel of claim 1, wherein the color adjustment layer is provided on at least one surface of the metal layer.

3. The bezel of claim 1, wherein the metal layer is provided between the substrate and the color adjustment layer.

4. The bezel of claim 1, wherein the color adjustment layer is provided between the substrate and the metal layer.

5. The bezel of claim 1, wherein the metal layer further comprises one or an alloy of two or more selected from the group consisting of Al, Cu, Ni, V, W, Ta, Mo, Nb, Ti, Fe, Cr, Co, Au, and Ag.

6. The bezel of claim 1, wherein the color adjustment layer further comprises one or two or more selected from the group consisting of oxides of a metal, nitrides of a metal, and carbides of a metal.

7. The bezel of claim 6, wherein the metal is one or an alloy of two or more selected from the group consisting of Al, Cu, Ni, V, W, Ta, Mo, Nb, Ti, Fe, Cr, Co, Au, and Ag.

8. The bezel of claim 1, wherein the metal layer further comprises copper, and the color adjustment layer further comprises oxides of copper.

9. A touch screen panel comprising the bezel of claim 1.

10. A display device comprising the bezel of claim 1.

11. The bezel of claim 1, wherein the color adjustment layer further comprises one or two or more oxynitrides of a metal selected from the group consisting of Cu, Ni, V, W, Ta, Mo, Nb, Ti, Fe, Cr, Co, Au, and Ag.

12. The bezel of claim 1, wherein the color adjustment layer further comprises one or two or more oxynitrides of a metal that is an alloy of two or more selected from the group consisting of Al, Cu, Ni, V, W, Ta, Mo, Nb, Ti, Fe, Cr, Co, Au, and Ag.

13. A method for manufacturing a bezel having a decorative color and a metal structure body for holding a display board, the method comprising:
    forming a metal layer comprising aluminum having a thickness of 1 nm to 10 μm on a substrate; and
    forming a color adjustment layer on the metal layer, the color adjustment layer having a thickness of 500 nm or less and an extinction coefficient in the range of 0.2 to 2.5 and comprising oxynitrides of aluminum,
    wherein the metal layer is a patterned metal layer, and the color adjustment layer is a patterned color adjustment layer, and
    wherein various colors are implemented by adjusting a thickness of the color adjustment layer.

14. The method of claim 13, wherein the color adjustment layer has a thickness of 500 nm or less.

15. The method of claim 13, wherein the forming of the metal layer uses a sputtering method, and the forming of the color adjustment layer uses a reactive sputtering method.

16. A method for manufacturing a bezel having a decorative color and a metal structure body for holding a display board, the method comprising:
    forming a color adjustment layer on a substrate, the color adjustment layer having a thickness of 500 nm or less and an extinction coefficient in the range of 0.2 to 2.5 and comprising oxynitrides of aluminum; and
    forming a metal layer comprising aluminum and having a thickness from 20 nm to 10 μm on the color adjustment layer,
    wherein the metal layer is a patterned metal layer, and the color adjustment layer is a patterned color adjustment layer, and
    wherein various colors are implemented by adjusting a thickness of the color adjustment layer.

\* \* \* \* \*